(12) United States Patent
Huang et al.

(10) Patent No.: US 8,301,103 B2
(45) Date of Patent: Oct. 30, 2012

(54) RECEIVER WITH IMPROVED FLICKER NOISE PERFORMANCE

(75) Inventors: Xiongchuan Huang, Eindhoven (NL); Guido Dolmans, Son en Breugel (NL)

(73) Assignee: Stichting IMEC Nederland, Eindhoven (NL)

( * ) Notice: Subject to any disclaimer, the term of this patent is extended or adjusted under 35 U.S.C. 154(b) by 257 days.

(21) Appl. No.: 12/879,071

(22) Filed: Sep. 10, 2010

(65) Prior Publication Data

US 2011/0065410 A1    Mar. 17, 2011

Related U.S. Application Data

(60) Provisional application No. 61/241,743, filed on Sep. 11, 2009.

(30) Foreign Application Priority Data

Feb. 1, 2010    (EP) ..................................... 10152334

(51) Int. Cl.
*H04B 1/10* (2006.01)
*H04B 1/16* (2006.01)

(52) U.S. Cl. ........ 455/296; 455/309; 455/312; 455/337; 375/324

(58) Field of Classification Search ........ 455/41.1–41.3, 455/296, 312, 330, 63.1, 222, 258, 309, 18, 455/336–337; 375/324–328
See application file for complete search history.

(56) References Cited

U.S. PATENT DOCUMENTS

| | | | |
|---|---|---|---|
| 4,577,157 A | 3/1986 | Reed | |
| 5,179,730 A * | 1/1993 | Loper | 455/266 |
| 5,212,826 A | 5/1993 | Rabe et al. | |
| 5,774,450 A * | 6/1998 | Harada et al. | 370/206 |
| 5,907,289 A * | 5/1999 | Kondo | 340/7.51 |
| 5,940,428 A * | 8/1999 | Ishiguro et al. | 375/150 |
| 6,018,364 A | 1/2000 | Mangelsdorf | |
| 6,181,740 B1 * | 1/2001 | Yasuda | 375/232 |
| 6,259,752 B1 | 7/2001 | Domino et al. | |
| 7,630,460 B2 * | 12/2009 | Mimura et al. | 375/340 |
| 7,760,819 B2 * | 7/2010 | Ishizaki et al. | 375/316 |
| 7,974,363 B2 * | 7/2011 | Yokoshima et al. | 375/316 |
| 8,125,258 B2 * | 2/2012 | Ishizaki | 327/161 |
| 2005/0003785 A1 * | 1/2005 | Jackson et al. | 455/260 |
| 2008/0252367 A1 * | 10/2008 | Pettersen et al. | 329/311 |

OTHER PUBLICATIONS

Lin, E.-Y.A., et al., "Power-efficient rendez-vous schemes for dense wireless sensor networks," IEEE International Conference on Communications, 2004, pp. 3769-3776, Jun. 2004.
Pletcher, N., et al., "A 65 µW, 1.9 GHz RF to digital baseband wakeup receiver for wireless sensor nodes," IEEE 2007 Custom Integrated Circuits Conference (CICC), pp. 539-542, Sep. 2007.

(Continued)

*Primary Examiner* — Simon Nguyen
(74) *Attorney, Agent, or Firm* — McDonnell Boehnen Hulbert & Berghoff LLP

(57) ABSTRACT

A method for demodulating an RF input signal using an envelope detector and synchronous switching of the input signal before entering and after leaving the envelope detector, the envelope detector having a non-linear transfer function acting essentially as a squaring function.

The invention also relates to an electronic receiver circuit performing such a method, and to an RF receiver comprising such an electronic receiver, and to an electronic device comprising such an RF receiver, and to the use of such an RF receiver as a wake-up receiver.

32 Claims, 10 Drawing Sheets

OTHER PUBLICATIONS

Daly, D.C., et al., "An Energy-Efficient OOK Transceiver for Wireless Sensor Networks," IEEE Journal of Solid-State Circuits, vol. 42, No. 5, pp. 1003-1011, May 2007.

Nathan Pletcher, et al., "A 2GHz 52 µW Wake-Up Receiver with -72dBm Sensitivity Using Uncertain-IF Architecture," 2008 IEEE International Solid-State Circuits Conference, 524-525 and 633, Feb. 2008.

Jan M. Rabaey, et al., "PicoRadios for Wireless Sensor Networks: The Next Challenge in Ultra-Low-Power Design," 2002 IEEE International Solid-State Circuits Conference, Feb. 2002.

Ruby, R. et al., "Ultra-miniature high-Q filters and duplexers using FBAR technology," 2001 IEEE International Solid-State Circuits Conference, Digest of Technical Papers, pp. 120-121, 438, Feb. 2001.

Otis, B.P.; Chee, Y.H.; Lu, R.; Pletcher, N.M.; Rabaey, J.M., "An ultra-low power MEMS-based two-channel transceiver for wireless sensor networks," 2004 Symposium on VLSI Circuits Digest of Technical Papers, pp. 20-23, Jun. 2004.

Sheng et al., "A Monolithic CMOS Low-IF Bluetooth Receiver," IEEE 2002 Custom Integrated Circuits Conference, pp. 247-250 (2002).

Sheng et al., "A 3V, 0.35 µm CMOS Bluetooth Receiver IC," 2002 IEEE Radio Frequency Integrated Circuits Symposium, pp. 107-110 (2002).

European Patent Office, European Search Report and communication regarding European Search Report for European Patent Application No. EP 10 15 2334, mailing date Jul. 22, 2010, 6 pages.

* cited by examiner

RECEIVER WITH IMPROVED FLICKER NOISE PERFORMANCE

REFERENCE TO PRIOR APPLICATIONS

This application claims the benefit of U.S. Provisional Application No. 61/241,743, filed on Sep. 11, 2009, entitled "Receiver Design with Improved Flicker Noise Performance." This application also claims the benefit of European Patent Application No. EP 10152334, filed on Feb. 1, 2010, entitled "Receiver with improved flicker noise performance." U.S. Provisional Application No. 61/241,743 and European Patent Application No. EP 10152334 are incorporated herein by reference.

FIELD

The present invention relates to a method for demodulating a radio frequency (RF) input signal, and to an electronic receiver circuit for performing such method. The invention also relates to an RF receiver containing such an electronic receiver circuit, and to an electronic device comprising such an RF receiver, in particular for use as a wake-up receiver.

BACKGROUND

This application focuses on a wireless communication receiver for ultra low power (e.g. less than 100 micro-watts (μW)) applications, such as can be used in wireless sensor networks (WSN) or wireless body networks (WBN).

An example of a low power RF receiver circuit used as a wake up receiver (WuRx) is described in IEEE 2007 Custom Integrated Circuits Conference (CICC), "A 65 μW, 1.9 GHz RF to Digital Baseband Wakeup Receiver for Wireless Sensor Nodes", by N. Pletcher, S. Gambini, J. Rabaey, p 539-p 542. This receiver circuit uses a tuned RF architecture with a bulk acoustic wave (BAW) filter to reduce out-of-band interference, a front end amplifier (FEA) to amplify the RF input signal, and an envelope detector to down-convert the on-off-keying (OOK) RF signal to baseband. A disadvantage of this architecture is that the noise of the envelope detector which essentially determines the sensitivity of the circuit needs to be entirely compensated by high gain of the front end amplifier. This consumes a lot of power.

SUMMARY

It is an object of the present invention to provide a method for demodulating an RF input signal using an envelope detector with a reduced power consumption without adversely affecting the receiver sensitivity.

This problem is solved by a method showing the technical features of the first claim.

A method is presented for demodulating an RF input signal to a demodulated output signal, comprising the steps of: receiving the RF input signal (e.g. by means of an antenna); providing a first clock signal having a first reference period and a first signaling period and a first clock frequency, and applying the first clock signal to a first switching block; switching in the first switching block to the RF input signal during the first signaling period and to a reference signal during the first reference period, thereby creating a first signal; demodulating the first signal by an RF front end comprising an envelope detector, the RF front end having a non-linear transfer-characteristic, thereby creating a second signal; providing a second clock signal having a second reference period and a second signaling period and a second clock frequency equal to the first clock frequency, and applying the second clock signal to a second switching and compensation block; sampling the second signal in the second switching and compensation block so as to store a first sample of the second signal during the second signaling period and to store a second sample of the second signal during the second reference period, and compensating the first sample by the second sample to obtain the demodulated output signal.

By combining the effect of switching at a first clock frequency whereby multiple sidebands or side-lobes are created in the frequency spectrum, and by using an envelope detector with a non-linear transfer function, which for small signals essentially acts as a squaring function in the time-domain or a convolution function in the frequency-domain, after the envelope detector a signal at around 0 hertz (Hz) is obtained with multiple side-lobes located at multiples of the switching frequency. Low frequency noise caused by the envelope detector is however added to the signal. This noise spectrum typically has an 1/f shape with an amplitude comparable to the amplitude of the signal 0 Hz, but with a much lower amplitude than the signal at higher frequencies. Instead of amplifying the incoming RF signal before entering the envelope detector (as is usually done in receivers to increase the signal over noise ratio and which consumes a lot of power), sampling is used, which folds the spectrum of the signal after the envelope detector in such a way as to essentially move the side-lobe and low noise located at 1× the sampling frequency to 0 Hz, thereby obtaining a baseband signal with a large signal to noise (S/N) ratio located at 0 Hz without increasing the gain of the signal entering the envelope detector, thereby saving power.

By applying the technique of switching the signal before entering the envelope detector, and sampling the signal after the envelope detector at the same frequency, the receiver circuit DC-offset is eliminated and the low frequency 1/f noise of the receiver circuit is high-pass filtered, so that the noise spectrum becomes essentially flat around direct current (DC), and the signal to noise ratio of the received signal is increased so that the sensitivity of the circuit is improved.

As the switching consumes only minimum power, the overall result is a receiver with a high sensitivity that consumes less power than is achievable by increasing the input gain, or generating a clock signal and mixing, or wideband amplification.

Additionally the resulting flat noise floor around 0 Hz of the output signal enables a flexible trade-off between data-rate of the incoming signal and receiver sensitivity, which allows different optimizations for different applications.

This technique offers the ability to separate the first side-lobe from the low frequency noise, by choosing a proper clock frequency.

In a preferred embodiment, the RF input signal is an on-off modulated RF carrier. In that case the RF receiver circuit acts as a signal-detector, and the signal reception does not suffer from non-linearity of the circuit. OOK (on/off keying) modulation is ideal for transmitting a plurality of bits, which can e.g. be used in a wake-up-receiver for transmitting an identification code, which can be checked before waking up the main receiver.

Preferably the first clock signal has a duty cycle of 50%, and the second clock signal has a duty cycle in the range of 10%-40%, preferably in the range of 20%-30%, more preferable essentially equal to 25%. By using a 50% duty cycle for the first clock signal, the noise added to the incoming signal can be easily compensated by measuring the output of the noise only, and compensating it by mere subtraction. By using a duty cycle in the range of 10%-40%, or even better 20%-30% for the second clock signal sufficient time is provided for storing the first and second sample, and timing problems inside the circuit can be avoided. A 50% duty cycle for the first clock and a 25% duty cycle for the second clock is particularly interesting because in that case all clocks can be derived from a single master clock using standard logic gates, which is energy efficient and facilitates in keeping the clocks synchronous.

Preferably the storage and compensation of the first and second samples of the second signal is achieved by connecting the second signal to a capacitor directly during the second signaling period, and inversely during the second reference period. By using a single capacitor and storing a positive charge during the signaling period and a negative charge during the reference period, only a single capacitor is needed and extra subtraction circuitry can be omitted.

Alternatively the storage of the first sample of the second signal is achieved by connecting the second signal to a first capacitor during the second signaling period, and the storage of the second sample of the second signal is achieved by connecting the second signal to a second capacitor during the second reference period, and the compensation is achieved by subtracting the charge stored on the second capacitor from the charge stored on the first capacitor. Preferably this subtraction is performed by a differential amplifier whereby the first capacitor is connected to a non-inverting input of the differential amplifier, and the second capacitor is connected to an inverting input of the differential amplifier.

Preferably the reference signal is an electrical ground (or more simply, ground). By using ground as the reference signal, circuitry and power for generating a calibration signal can be omitted.

Optionally the RF input signal is filtered by an RF bandpass filter before being applied to the first switching block, to reduce out-of-band interference and to prevent folding of wideband thermal noise into the baseband. By rejecting out-of-band signals, interfering signals can be suppressed. By avoiding wideband thermal noise into the baseband the sensitivity of the receiver can be further increased.

Optionally the second signal is amplified by means of a baseband amplifier, located between the envelope detector before being sampled in the second switching and compensation block.

As the signal leaving the envelope detector is located 0 Hz and a side lobe at the first switching frequency, which is much lower than the carrier frequency, the signal can be amplified by a baseband amplifier, which amplification is more power efficient than amplifying the incoming RF signal directly, before entering the envelope detector, as is usually done. And when the output signal is converted to digital in an analog-to-digital converter (ADC), it is more power efficient to convert a low frequency signal.

Preferably the second signal is filtered by means of a second band-pass filter for retaining only one side lobe, preferably the side lobe located at the first clock frequency, before being sampled in the second switching and compensation block. By suppressing all information except for one side lobe, the side lobe will be folded to 0 Hz with a minimal noise floor. Selecting the first side lobe is preferred because this has more energy than the other side lobes, which is beneficial for the power and sensitivity of the receiver.

Preferably the first clock frequency is higher than the corner frequency of the 1/f noise and thermal noise intercept point of the RF front end. By choosing a clock signal with such a frequency, the side lobe at the first clock frequency can be shifted into the flat noise region, where the noise is minimal.

The disclosure also relates to an electronic receiver circuit performing such a method.

The disclosure also relates to an RF receiver comprising such an electronic receiver circuit.

The disclosure also relates to an electronic device comprising such an RF receiver, such as e.g. a wireless sensor node in a wireless sensor network (WSN) or a wireless body sensor device implanted in a human body.

The disclosure also relates to the use of such an RF receiver as a wake-up receiver, which can be always on, thanks to the very low power consumption.

BRIEF DESCRIPTION OF THE DRAWINGS

Presently preferred embodiments are described below in conjunction with the appended drawings, wherein like reference numerals refer to like elements in the various drawings, and wherein.

DETAILED DESCRIPTION

Figure 1:
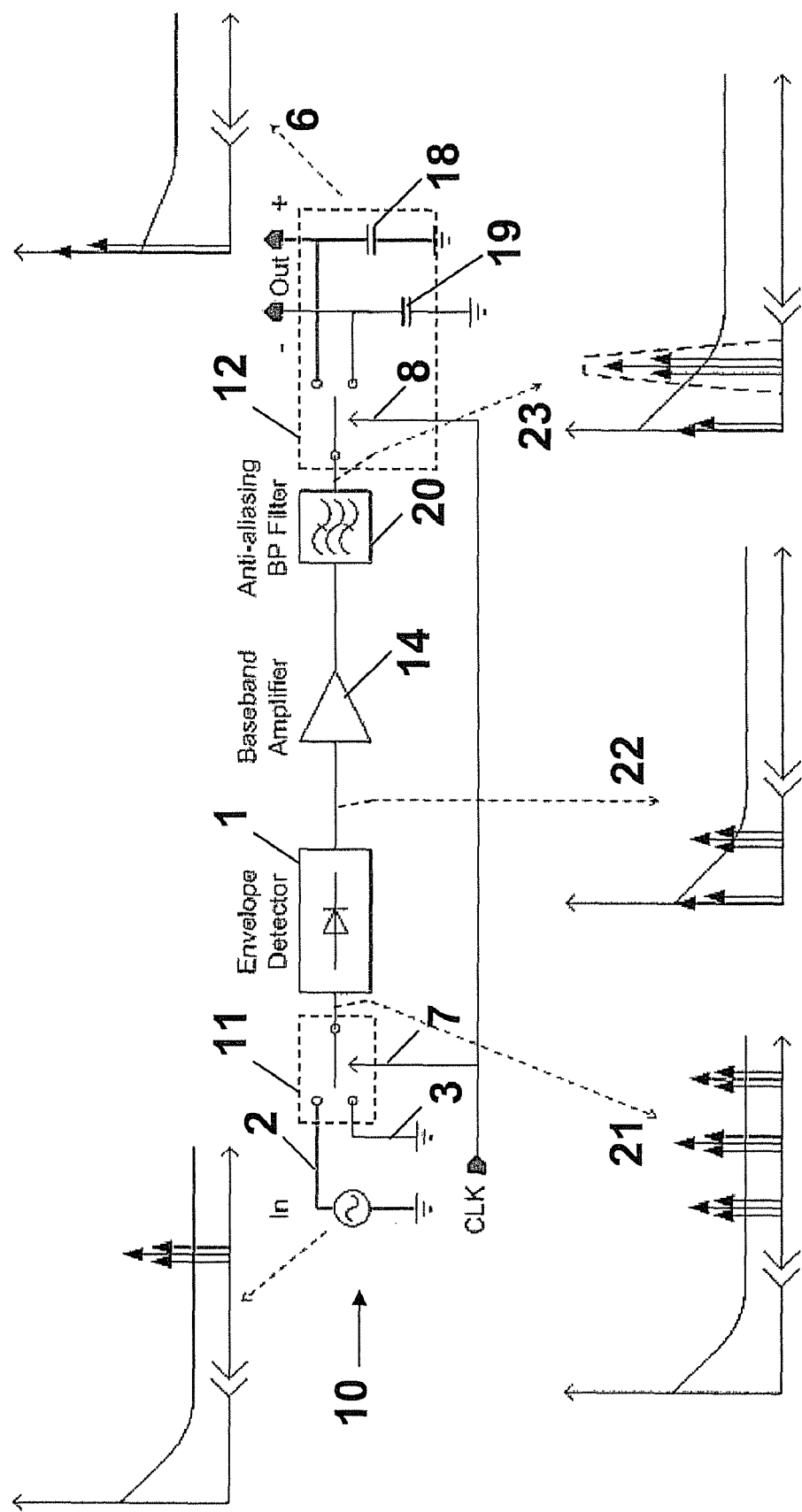
FIG. 1 illustrates the system of the present disclosure.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present invention, the only relevant components of the device are A and B.

In ultra-low power receivers, the data-rate could be traded for sensitivity. If the signal bandwidth can be kept low, out-of-band white noise could be filtered out so that the signal to noise ratio (SNR) will improve. However as far as flicker noise (also called 1/f noise) is concerned, the trade-off between signal bandwidth and sensitivity is inefficient due to the fact that the lower the baseband frequency, the higher the flicker noise power spectrum density (PSD).

In [2] the baseband frequency is kept high. AC coupling between blocks can help to suppress flicker noise. However the baseband signal suffers from wideband thermal noise and the actual sensitivity is still low. In [7] another realization is presented of ultra-low power receiver based on an envelope detector. It adds more gain in front of the envelope detector so that the thermal and flicker noise is suppressed. Inevitably, the extra gain stages consume a considerable amount of power. The total power consumption of the receiver in [7] is more than 10 times higher than [2] for this sensitivity improvement. In an attempt to suppress noise from an envelope detector, typically the input swing is increased at the envelope detector. In other words, more gain is put at the RF front-end, which translates to higher power consumption due to parasitic effects.

Furthermore, the thermal noise cannot be eliminated due to its ubiquitous nature. It could only be filtered out so that the total noise power is reduced. The flicker noise, on the other hand, could be suppressed by circuit techniques. Several analog techniques have been developed to remove amplifier DC offset and suppress low frequency flicker noise, such as auto-zeroing (AZ), correlated double sampling (CDS), and chopper stabilization (CHS). Conventionally these techniques are applied to linear circuits, i.e. the output/input transfer function can be approximated in first-order and no frequency translation happens.

The present disclosure presents an envelope detecting circuit arranged for detecting an input signal. The circuit comprises at the input a first switching block arranged for switching between the input signal and a reference signal. Preferably, the reference signal is ground. The circuit further comprises a second switching block at the output. The circuit comprises a clock circuit for generating clock signals for controlling the switching blocks. The output of the circuit is sampled during two instances: a) when the input is connected to the input signal; b) when the input is connected to reference (ground, i.e. no signal). Two output samples are compared. Since the output sample taken during the signaling period contains the down-converted information as well as noise and offset, while the output sample taken during the reference period only contains noise and offset, the subtraction of the two output samples will cancel out the offset and high-pass filter the flicker noise.

The circuit preferably comprises an amplifying block and a filtering block. An anti-aliasing filter can be added before the sampling process in order to reduce folding of wideband thermal noise into baseband. A baseband amplifier can be added between the envelope detector and filter to compensate the signal loss due to the envelope detector.

The clock signal for controlling the input switching and output switching or sampling is preferably synchronized and matched to the signal delay sustained in the active path, i.e. envelope detector, amplifier, and filter.

In this disclosure, drawbacks of transceivers based on non-linear envelope detectors, namely excessive flicker noise and DC offset, are removed by synchronous switching techniques. The sensitivity is improved with little extra power consumption and circuit complexity, in other words, for a given sensitivity, the power consumption can be decreased.

This disclosure provides a solution to apply offset and flicker noise cancellation techniques to an envelope detector. It is very suitable for ultra-low power receivers used in wireless sensor networks since the transceivers should have low data-rate, moderate sensitivity, while very low power consumption.

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes.

In ultra-low power receivers (applicable in for example wireless sensor networks or wireless body area networks) where the envelope detector is largely used, the gain preceding the detector is limited due to limited power available for front-end amplifiers like LNA (low noise amplifier). Thus, the envelope detector turns out to be the bottleneck of the receiver sensitivity due to its attenuation nature and high thermal and flicker noise contribution.

FIG. 1 shows a block diagram of an electronic receiver circuit 10 according to an embodiment of the present invention. At the input the signal is an RF carrier modulated by a low frequency baseband signal. The signal is periodically fed to the input of the envelope detector 1, effectively being on/off modulated via a switching block 11 controlled by the clock signal "CLK" 7. The CLK signal 7 runs at a frequency higher than the flicker noise corner of the active circuitry including envelope detector 1, baseband amplifier 14, and the filter 20. The signal spectrum of the first signal 21 at the output of the first switch 11 is expanded by multiples of CLK frequency, which is shown in the lower left spectrograph (higher harmonics ignored for simplicity). After the envelope detector 1, the baseband now sits outside of the flicker noise region, and then is amplified and filtered by the baseband stages 14, 20. At the output 23, the signal with noise/offset is sampled to one of the capacitors 18, 19 and the pure noise/offset is sampled to the other 19, 18. Since the sample and hold process is in fact multiplying the signal with a square wave, the signal out of the filter 20 is eventually shifted back to baseband, while the offset and flicker noise is suppressed.

Figure 2:
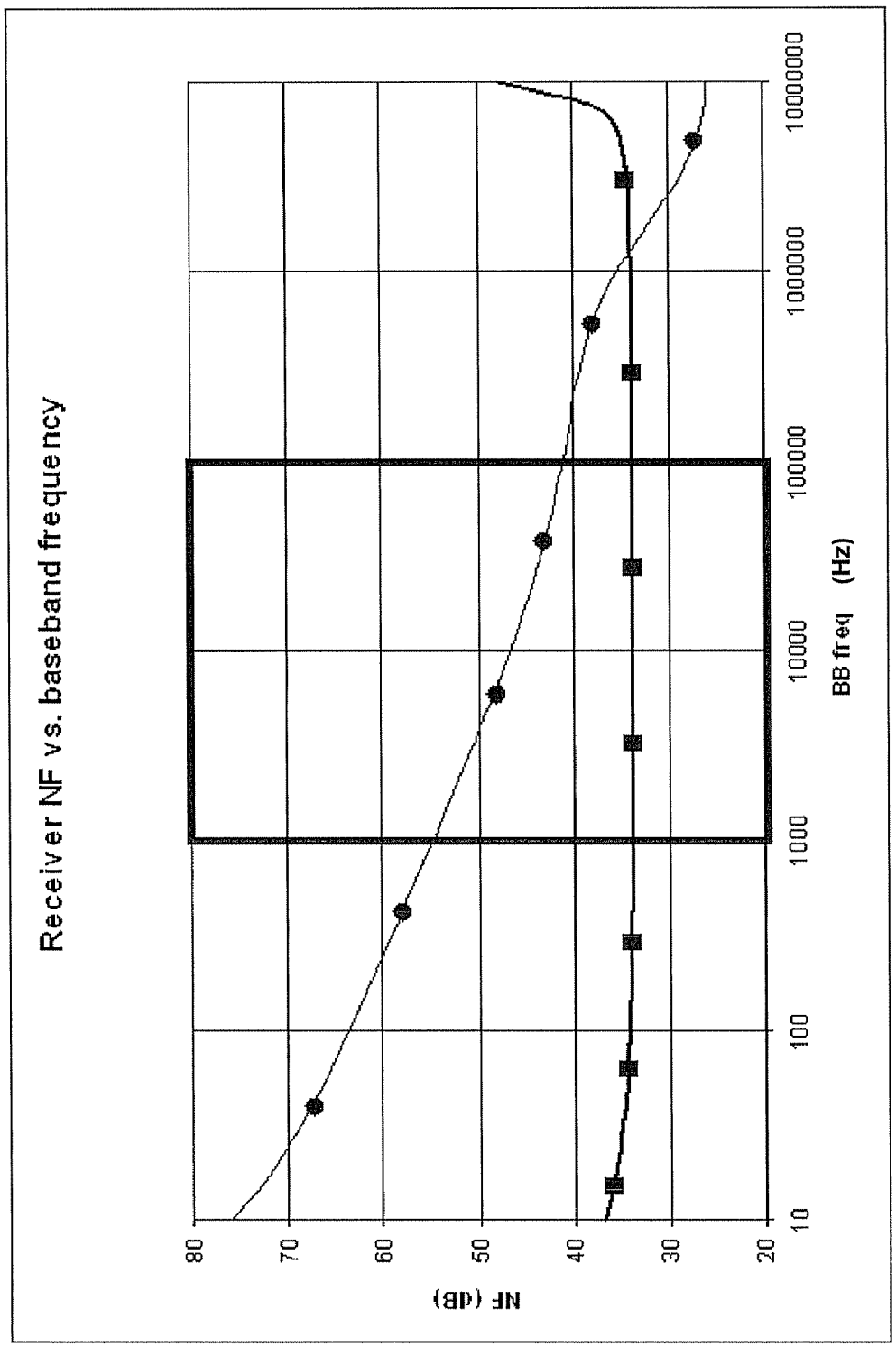
FIG. 2 shows the simulated results of the noise figure of an envelope detector.

FIG. 2 shows the simulated result of an RF front-end with an envelope detector and synchronous switching at 10 MHz (curve with squares), according to the present invention. The curve with circles is the simulated result without synchronous switching. Comparing the conventional operation of envelope detector and the synchronous switching operation proposed by this work, there is a clear improvement in low frequency noise power spectrum density (PSD) or noise figure (NF) from this invention. The bold-faced rectangle in FIG. 2 illustrates the 1 kHz to 100 kHz baseband (BB) frequency range in which the noise figure is much smaller with double sampling. Such frequency range is an example frequency range for a radio implementation that has a data-rate in that frequency range.

An example of an envelope detector based wake-up receiver front-end that incorporates synchronous switching has been implemented. It suppresses the 1/f noise and DC offset, resulting in a signal with a constant output noise floor. This enables an exchange of data-rate for sensitivity, which is useful for low power, low rate wake-up receivers. The receiver consumes 51 μW and occupies 0.36 mm2 in 90 nm complementary metal oxide semiconductor (CMOS). For 10 kilobits per second (kbps) on off keying (OOK) reception it can achieve −69 dBm and −80 dBm sensitivity at a carrier frequency of 2.4 GHz and 915 MHz respectively.

In order to simultaneously optimize network lifetime and latency in wireless sensor networks (WSN), an always-on wake-up receiver (WuRx) can be used to monitor the radio link continuously. For truly autonomous sensor nodes employing energy scavenging, only 50 μW power is available for the WuRx [1]. An envelope detector is a popular choice in WuRx because of its low power consumption. However, the envelope detector is always the bottleneck of the receiver sensitivity since it attenuates low level input signal and adds excessive noise. One traditional way of improving sensitivity is to amplify the signal before the envelope detector, for example at RF [2, 3] or IF [4] stages, to enhance signal over noise ratio (SNR) at the output.

A synchronous switching technique is applied before and after the down-converting envelope detector 1, so that the offset and flicker noise is suppressed. It not only improves the receiver sensitivity, but also enables a flexible trade-off between data-rate and sensitivity due to the resulting flat noise floor. This is clearly an advantage for a WuRx since it does not require high data-rate [5].

Figure 3:
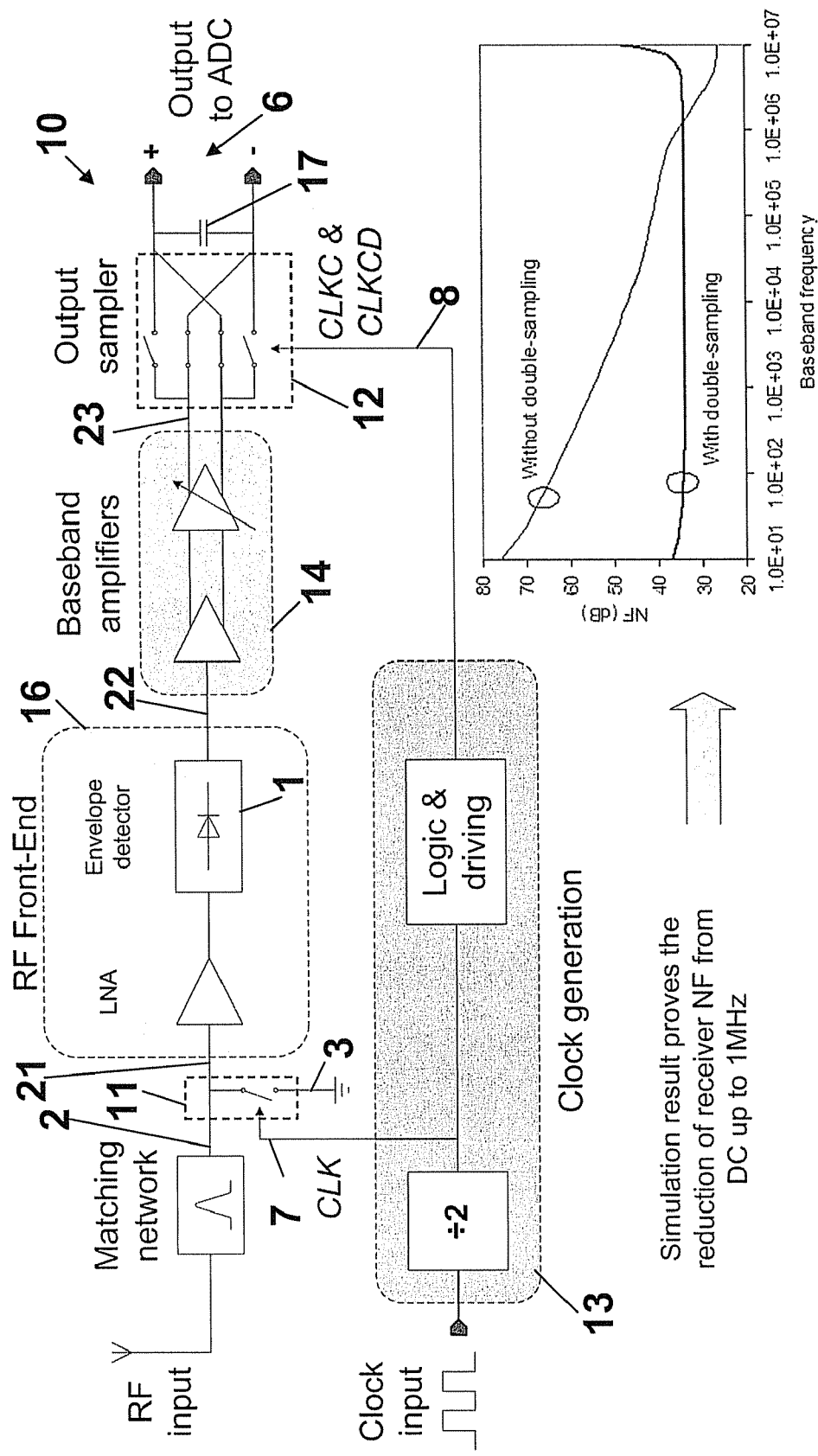
FIG. 3 shows a wake-up receiver block diagram with RF front-end, baseband amplifiers, and synchronous switching circuitry.

FIG. 3 shows an RF receiver block diagram according to an embodiment of the invention. It consists of an RF amplifier (LNA), an envelope detector 1, two baseband amplifiers 14, a clock generation circuit 13 and two switching blocks 11, 12. The RF amplifier (LNA) provides just enough gain to suppress the thermal noise from the envelope detector 1; most of the amplification takes place at the baseband for better power efficiency. The input of the RF front-end (16) is alternated between ground 3 and the antenna input 2, while the output 23 is sampled twice to distinguish signal and noise.

Figure 4:
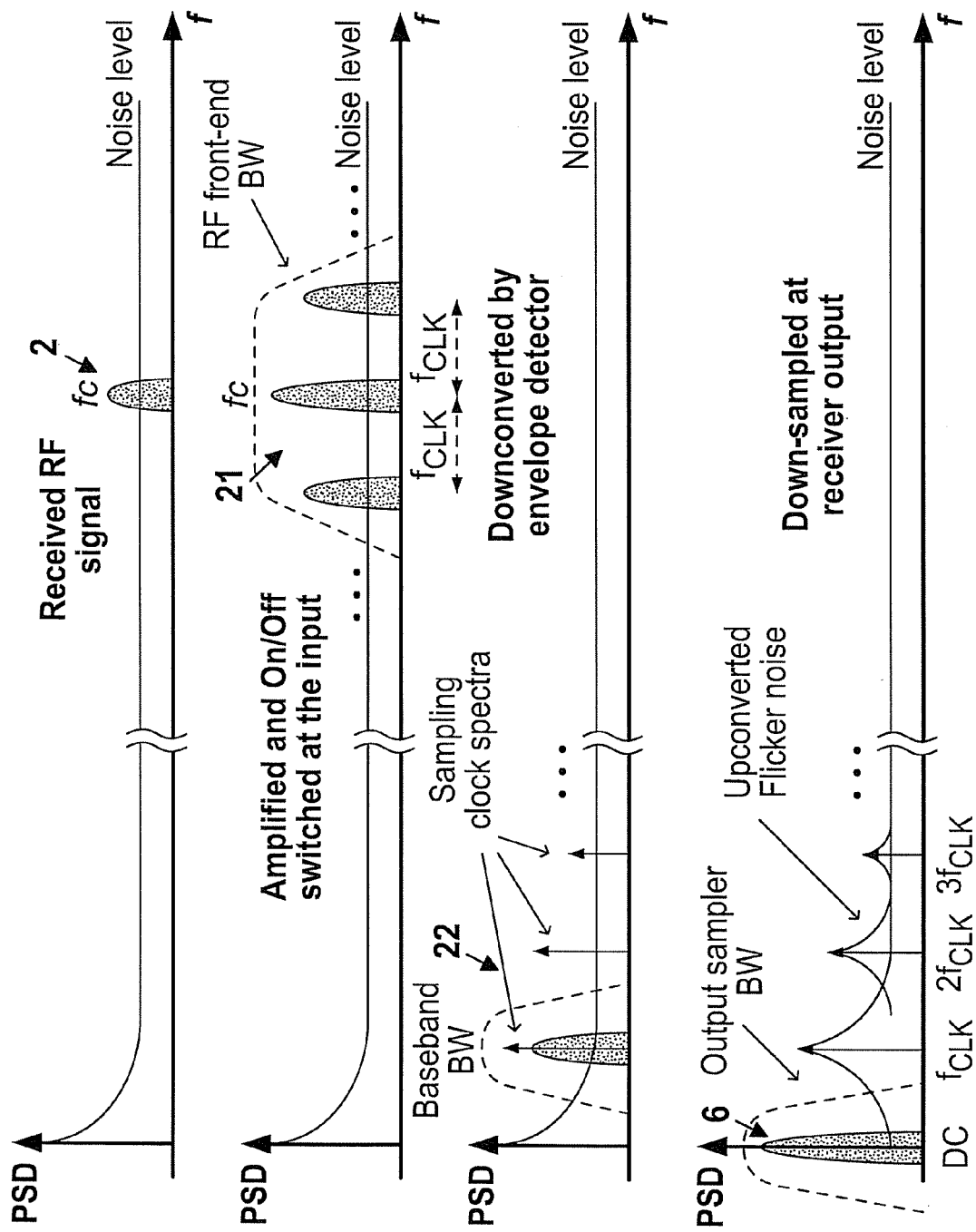
FIG. 4 illustrates the concept of synchronous switching in the frequency domain.

FIG. 4 illustrates the receiver operation in the frequency domain. The incoming RF signal 2 is modulated by the first switching block 11 to add sidebands or side-lobes which are multiples of fCLK away from the original carrier (fc). After envelope detection, the signal 22 is down-converted to 0 Hz (showing lobes at 0 Hz and at multiples of fCLK). This is an effect of a non-linear transfer characteristic of the envelope detector, which for small signals can be approximated by its Taylor series. However (in contrast to the prior art, where the DC-part of the second order component is used) the squaring effect of the envelope detector 1 is exploited. This squaring effect in the time domain, which means multiplication of a signal with itself, corresponds to a convolution in the frequency domain of the signal with itself, thereby creating a spectrum with lobes at 0 Hz and at multiples of fCLK. Preferably the synchronous switching frequency fCLK is chosen beyond the 1/f corner frequency of the receiver circuit 10, in this case 10 MHz, so that the down-converted signal 22 at the output of the envelope detector is away from the flicker noise. Preferably this signal is band-pass filtered to suppress all signals except for the first side-lobe at 1× fCLK. The method would also work without band-pass filtering, but the signal-to-noise ratio would be less. Preferably the baseband signal 22 is amplified by a baseband amplifier 14. Then the signal 22 is sampled back to DC by the second switching block 12, while the flicker noise and low-frequency offset is up-converted to multiples of fCLK and filtered out in the final output 6.

Figure 5:
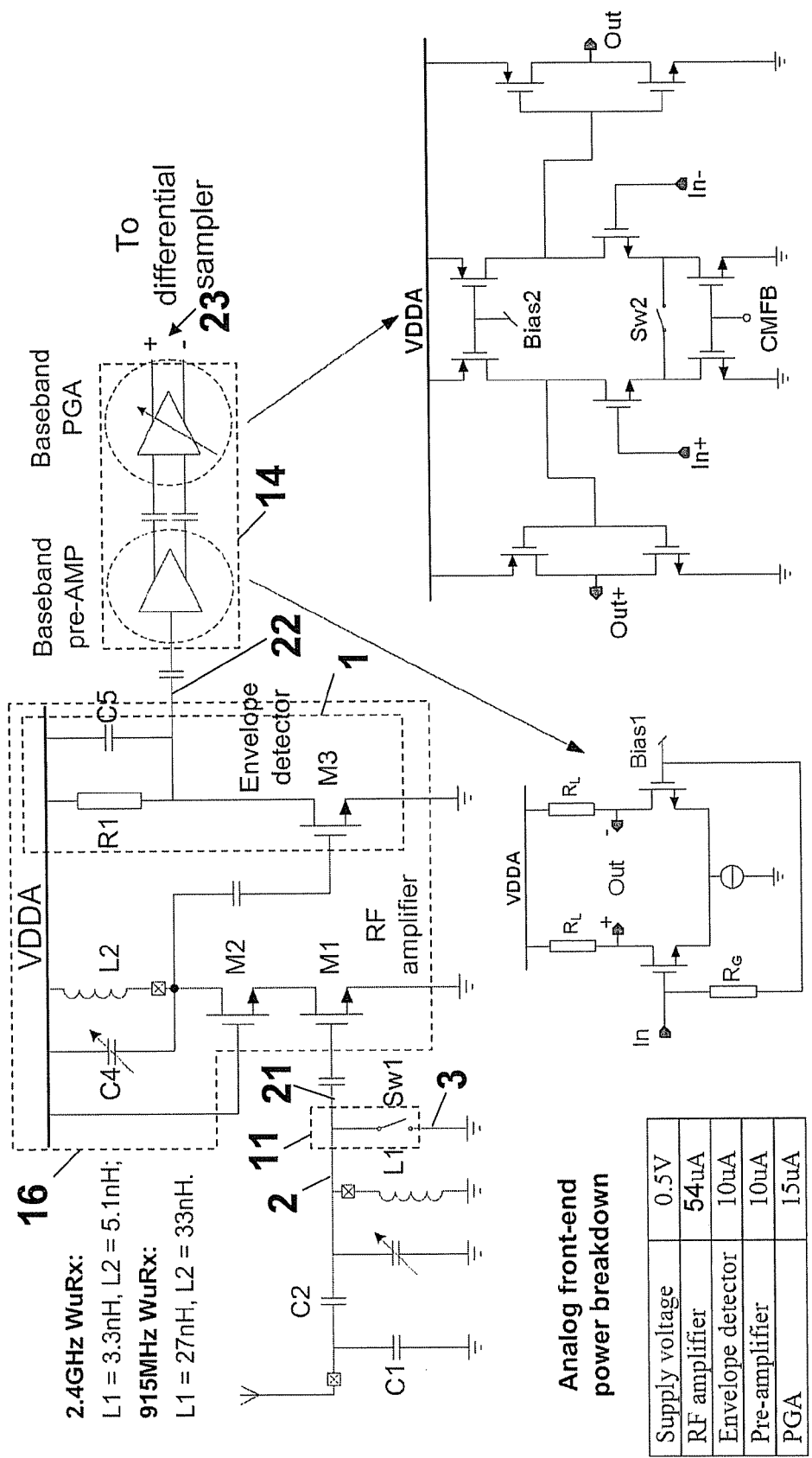
FIG. 5 shows a schematic of a wake-up receiver circuitry.

FIG. 5 shows an example of the schematic of a receiver analog circuitry according to an embodiment of the invention. The analog front-end is designed for 0.5V supply voltage (VDDA) to reduce power consumption. The RF amplifier is implemented as a cascoded common-source negative-channel metal-oxide semiconductor (NMOS), and it is optimized for gain instead of noise figure (NF) since the overall noise performance is dominated by the envelope detector 1. The matching network is realized as a capacitive transformer with a high-Q off-chip inductor L1 to achieve high voltage gain. Another off-chip inductor L2 serves as the tuned load of the amplifier. By changing these two inductors, the receiver is able to operate in different frequency bands, e.g. 868/915 MHz or 2.4 GHz ISM bands. The output of the RF amplifier is fed to the envelope detector 1, which is a single NMOS common source stage with a resistor-capacitor (RC) load. The cut-off frequency of the RC load is so chosen that the fundamental tone (at the carrier frequency) is sufficiently suppressed, while the desired information around fCLK is preserved. No DC reference is needed for the detector output because the original baseband information is moved to fCLK. The RF amplifier and envelope detector consume 54 μA and 10 μA respectively.

The baseband stage consists of a pre-amplifier and a programmable gain amplifier (PGA). The pre-amplifier uses a differential pair to convert the single-ended detector output into differential signals with low added noise. The two-stage fully differential PGA works in open-loop instead of feedback mode for better power efficiency. The gain can be chosen high or low by switching on or off Sw2 in FIG. 5. The output of the PGA is able to reach rail-to-rail, maximizing the dynamic range at low supply voltages. The two baseband amplifiers provide roughly 40 dB and 20 dB gain at high and low gain mode, and consume 24 μA in total. Due to alternating current (AC) coupling between stages and the limited bandwidth of the amplifiers, the gain response is band-pass, enclosing fCLK (10 MHz). This can limit wideband noise fold-back during the final switching process.

Figure 6:
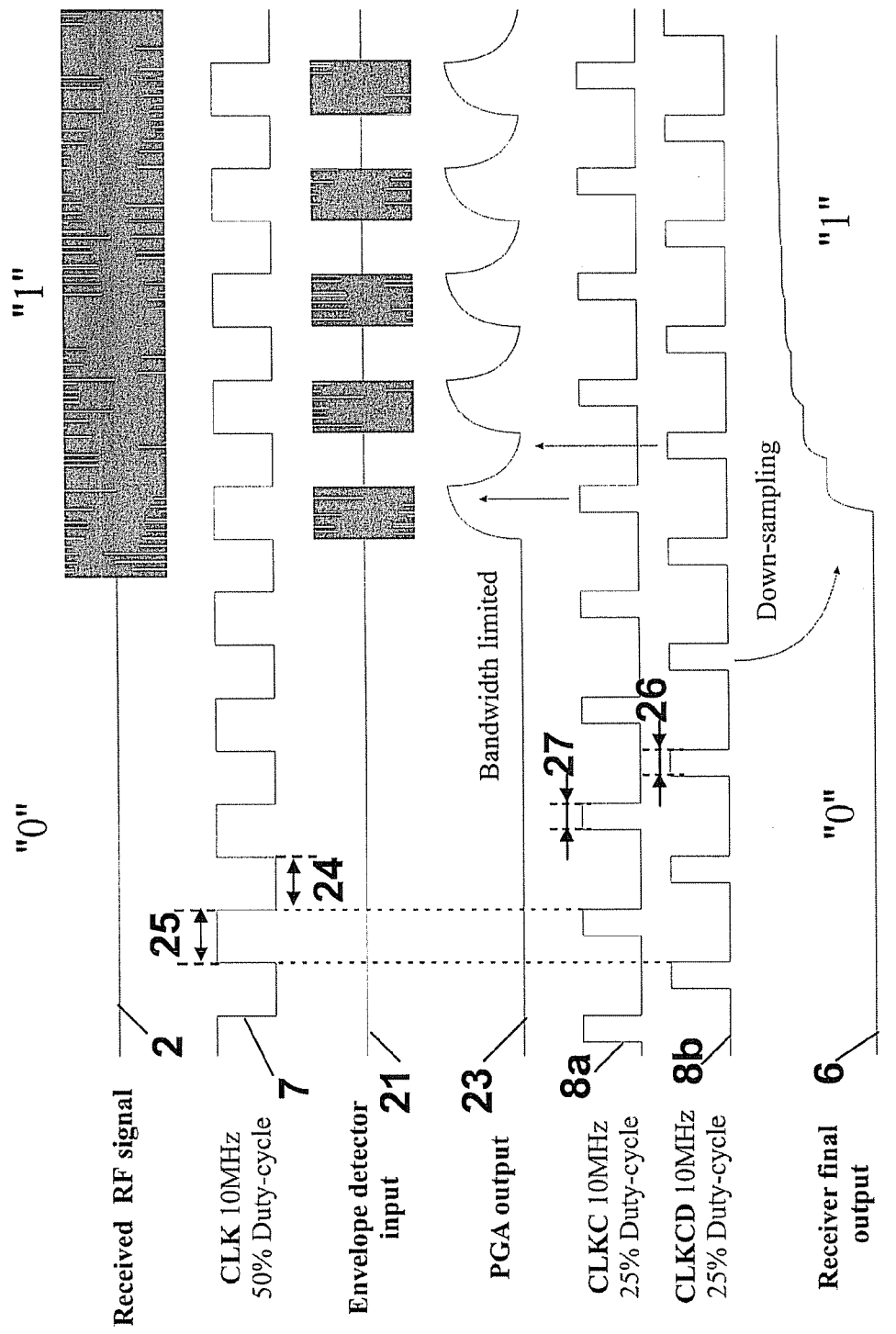
FIG. 6 illustrates the signal and clock timing in the receiver chain.

FIG. 6 illustrates the clocking scheme. Signal CLK 7 is applied to the first switching block 11 to switch on and off the receiver input signal 2. It preferably has a duty cycle of 50%. CLKC 8a and CLKCD 8b are applied to the second switching block 12 to control the output differential sampler. CLKC and CLKCD have the same frequency as CLK but are delayed by ¼ clock cycle and are duty-cycled to about 25% so that only the peak of the PGA output waveform is sampled onto the output capacitor 17. The duty cycle does not need to be exactly 25% however, it can also be higher or lower, e.g. 10%-40%. It is important that the first switching block 11 and the second switching block 12 are operated synchronously, so that the reference output is stored while the reference signal is applied to the envelope detector, and the signaling output is stored while the signal input is applied to the envelope detector. The supply voltage for the digital part is 1V for standard logic design and better switch performance. The jitter requirement for the clock source 13 is not important as long as all clock signals CLK 7, CLKC 8a, CLKD 8b are synchronous. In this work, all these clock signals are derived from a 20 MHz external clock by a frequency divider and logic gates consuming 3 μW active power. If a 3-stage ring oscillator is integrated as the clock source, its added power consumption will be less than 2 μW in the given technology. The receiver was demonstrated for 915 MHz and 2.4 GHz band with different off-chip inductors. The suppression of flicker noise is verified by the flat noise floor at the output 6.

Figure 9A:
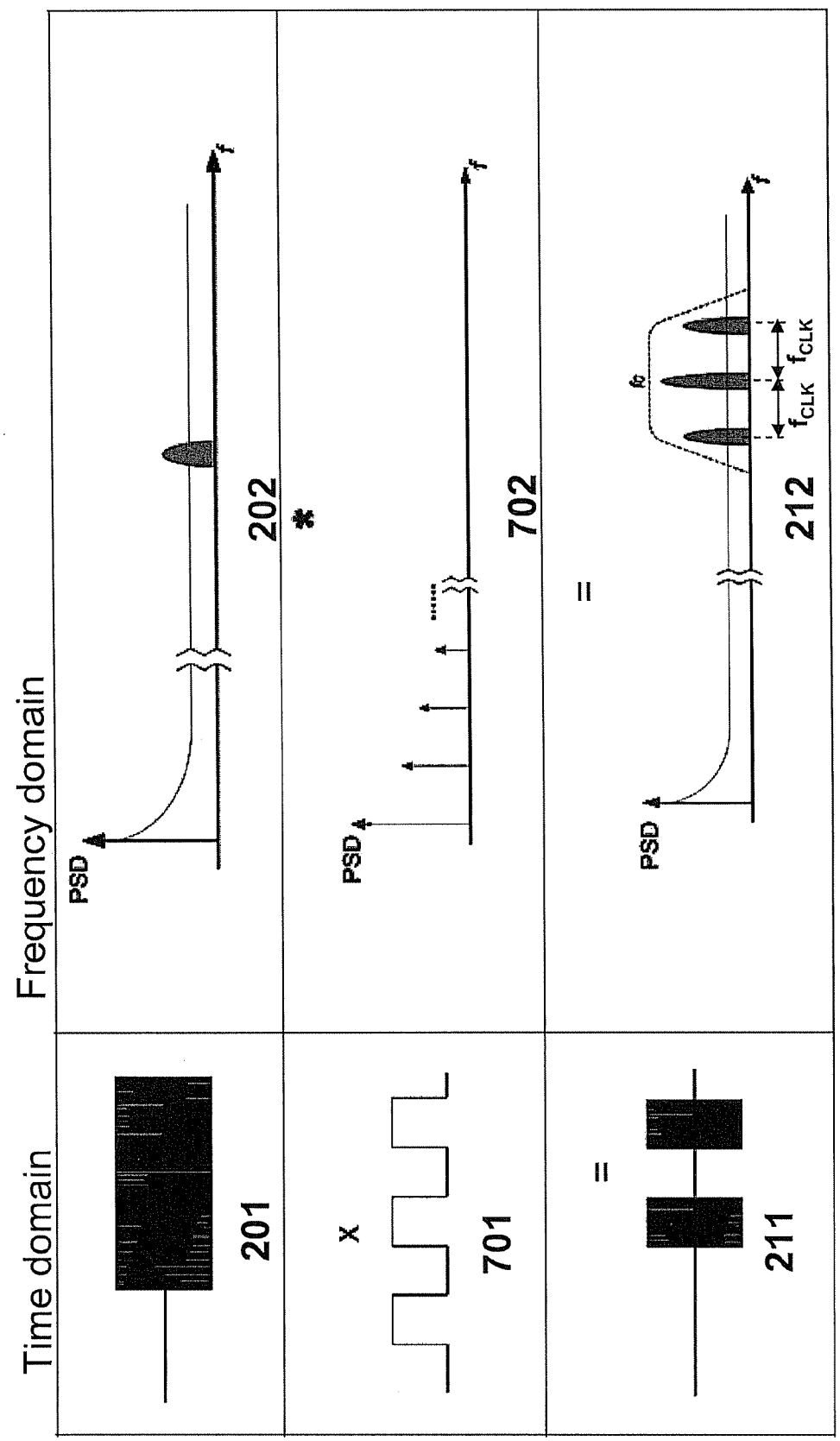
FIG. 9A and FIG. 9B give a complete picture in the time and frequency domain of the signals shown in FIG. 4 and FIG. 6.
Figure 9B:
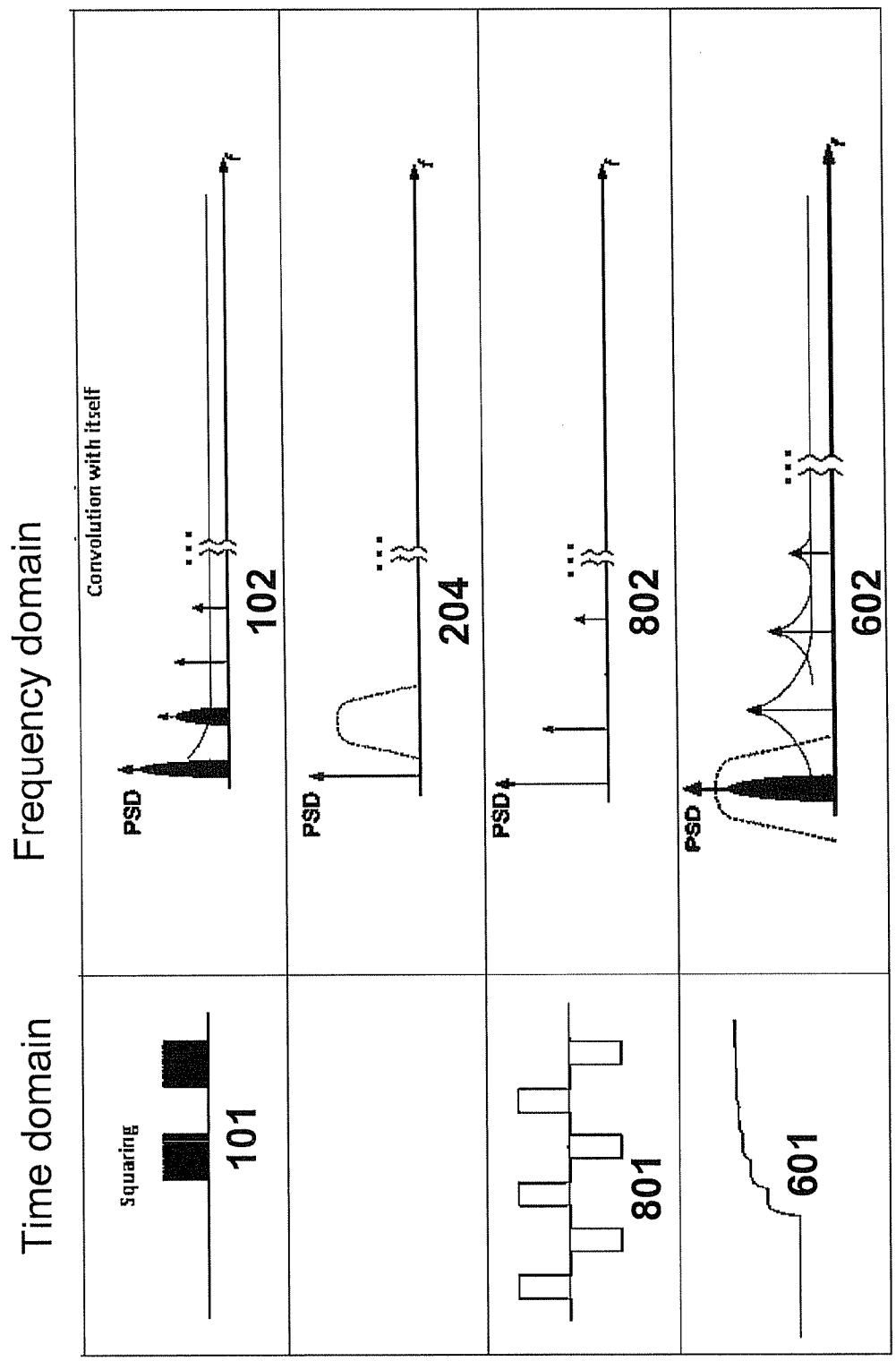

FIG. 9A and FIG. 9B illustrate the receiver operation according to a preferred embodiment of the invention in the time and frequency domain in detail. The incoming RF carrier signal 2 is represented in FIG. 9A by 201 (time domain) and 202 (frequency domain). This signal is modulated by the first switching block 11. In other words, the input signal 201 is multiplied in the time domain with a square-wave 701 and convoluted in the frequency domain with a Fourier series 702. The input of the envelope detector 1 is represented in FIG. 9A by 211 (time domain) and 212 (frequency domain). This signal enters the envelope detector 1, which for small signals essentially acts as a squaring function in the time-domain, as explained above, yielding signal 101 in the time domain and signal 102 in the frequency domain, and taking into account that multiplication in the time domain corresponds to convolution in the frequency-domain. A band-pass filter 20 may be applied after envelope detection, shown by 204 in FIG. 9B. Optionally this signal is also amplified by a baseband amplifier. The signal is then sampled in the second switching block 12, and stored to a first or second capacitor. This can be represented by multiplication with a clock-signal as illustrated by 801 (time domain) or convolution with the Fourier series 802, yielding the output signal 601 (time domain) and 602 (frequency domain). Due to the sampling, the flicker noise and low-frequency offset is also up-converted to multiples of fCLK, while the low noise floor at fCLK is moved to 0 Hz.

Figure 7:
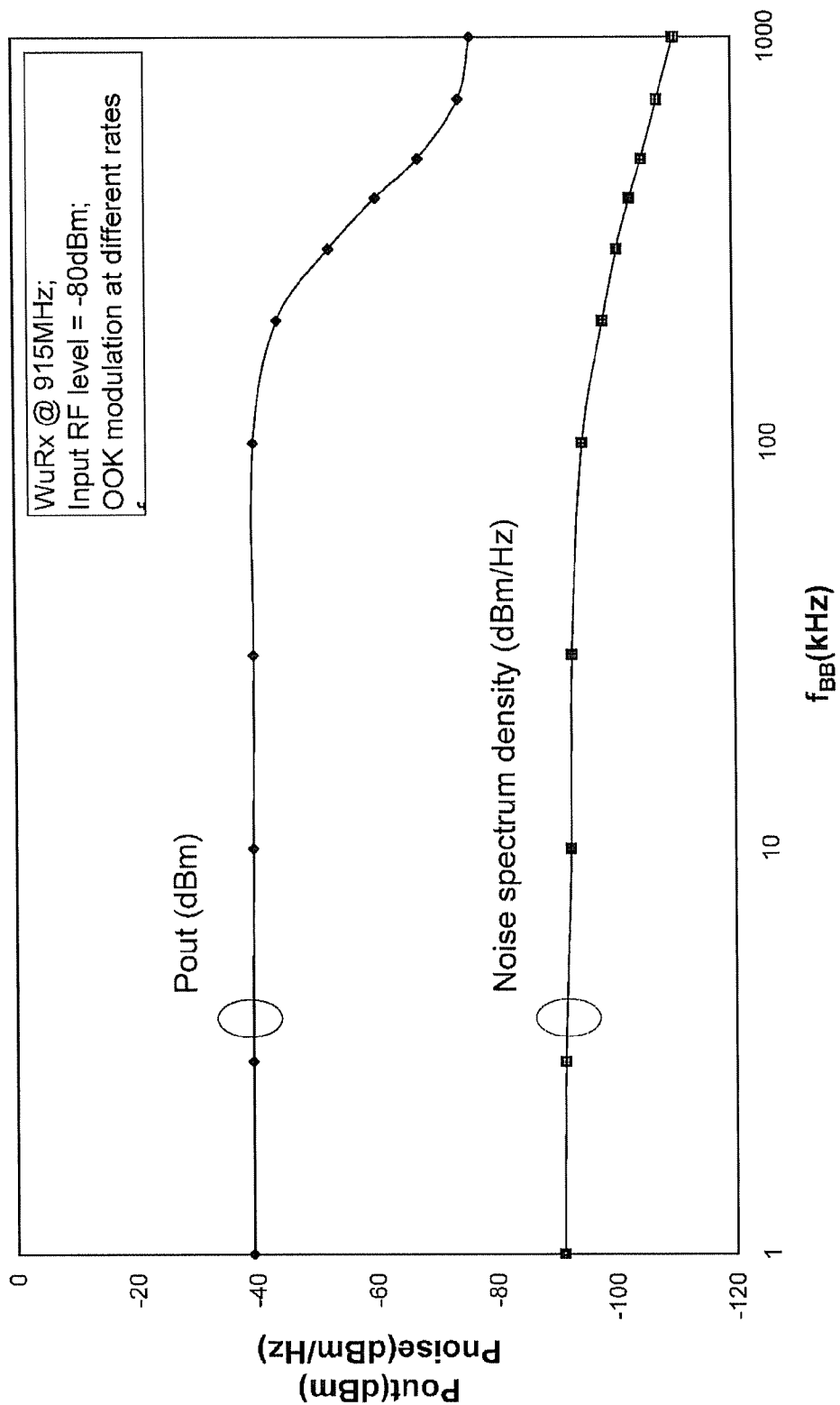
FIG. 7 shows measurement results of baseband signal level and output noise floor for a 915 MHz wake-up receiver.

FIG. 7 shows the output signal 6 and noise level for the 915 MHz WuRx when the input OOK signal is at −80 dBm. Both the noise spectrum density and the output signal stay flat for the baseband up to 100 kHz. The receiver DC offset is also reduced from tens of mV to less than 1 mV in typical samples. The residue offset is introduced by the clock feed-through and charge-injection effect.

Figure 8:
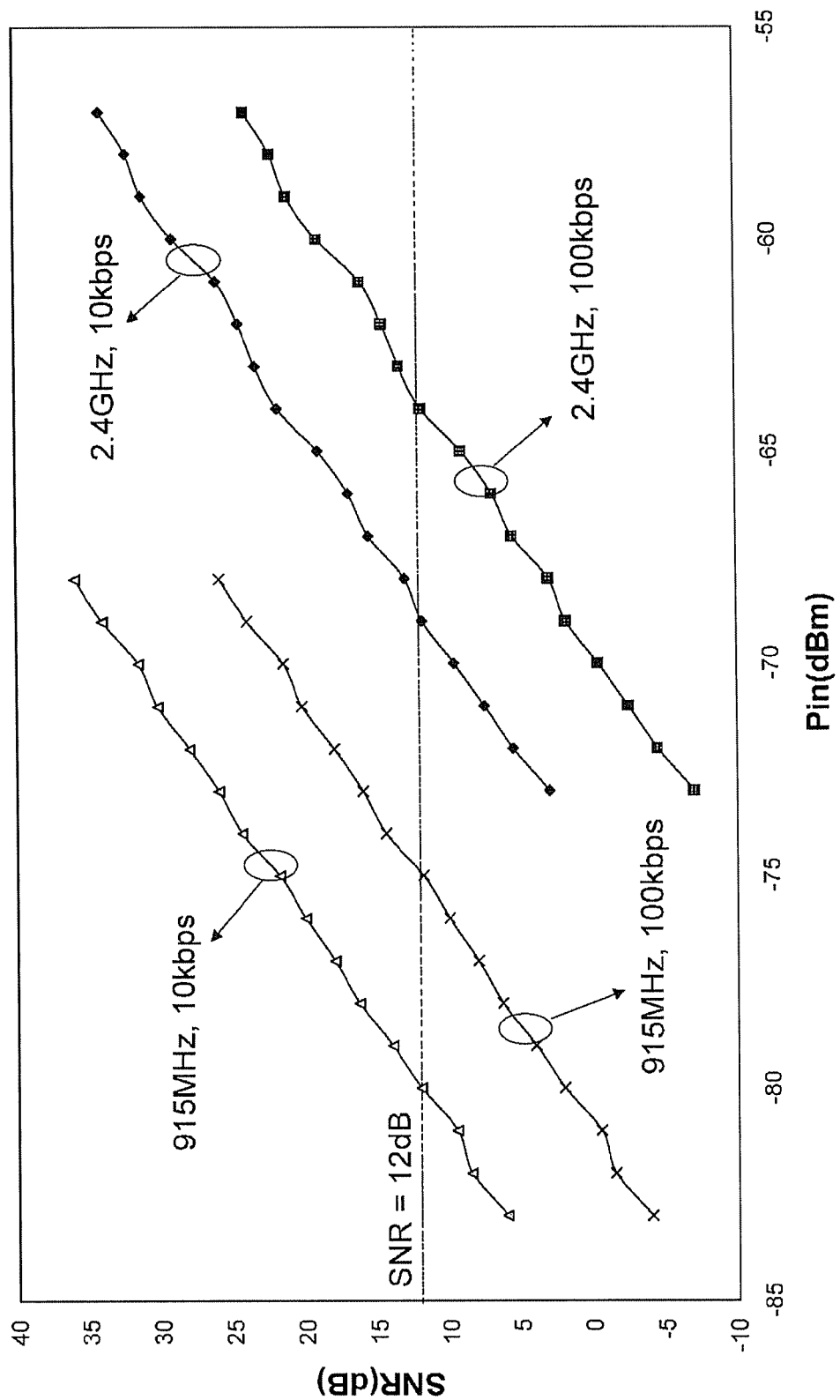
FIG. 8 shows the measured output SNR with different carrier and data-rate settings as a function of input RF level.

FIG. 8 shows the achievable SNR for different carrier and data-rate settings. It is assumed that noise bandwidth is twice the signal bandwidth, and the signal power is compared to the integral of noise density within this bandwidth. For a 915 MHz WuRx and 100 kbps OOK modulation, the receiver sensitivity (SNR>12 dB) is −75 dBm; if the data-rate can be scaled down to 10 kbps and out-of-band noise is filtered e.g. by a Surface Acoustic Wave (SAW) or a Bulk Acoustic Wave filter (BAW), the sensitivity will be improved by 5 dB (instead of 10 dB due to the quadrature input/output characteristic of the envelope detector 1. For the 2.4 GHz WuRx, the sensitivity is −64 dBm and −69 dBm for 100 kbps and 10 kbps data-rate respectively. Compared to receivers using similar topology [2, 3], the synchronous switching technique improves sensitivity by suppressing flicker noise and low frequency offset. The resulting flat noise floor also enables flexible choice in data-rate and sensitivity. The 3 dB RF bandwidth of the receiver is 21 MHz and 56 MHz for the 915 MHz and 2.4 GHz WuRx respectively. The bandwidth is determined by the frequency response of the matching network and RF amplifier; if high-Q filter [3, 6] is adopted, the selectivity and frequency stability can be further improved.

REFERENCES

[1] Lin, E.-Y. A., et al., "Power-efficient rendezvous schemes for dense wireless sensor networks," IEEE International Conference on Communications, 2004, pp. 3769-3776, June 2004.
[2] Pletcher, N., et al., "A 65 µW, 1.9 GHz RF to digital baseband wakeup receiver for wireless sensor nodes," IEEE Custom Integrated Circuits Conference, 2007. pp. 539-542, September 2007.
[3] Daly, D. C., et al., "An Energy-Efficient OOK Transceiver for Wireless Sensor Networks," IEEE Journal of Solid-State Circuits, vol. 42, no. 5, pp. 1003-1011, May 2007.
[4] Nathan Pletcher, et al., "A 2 GHz 52 µW Wake-Up Receiver with −72 dBm Sensitivity Using Uncertain-IF Architecture". IEEE International Solid-State Circuits Conference, 525-526 and 633, February 2008.
[5] Jan M. Rabaey, et al., "PicoRadios for Wireless Sensor Networks: The Next Challenge in Ultra-Low-Power Design". Proceedings of the International Solid-State Circuits Conference, February 2002.
[6] Ruby, R. et al., "Ultra-miniature high-Q filters and duplexers using FBAR technology," International Solid-State Circuits Conference, 2001. Digest of Technical Papers. pp. 120-121, 438, February 2001.
[7] Otis, B. P.; Chee, Y. H.; Lu, R.; Pletcher, N. M.; Rabaey, J. M., "An ultra-low power MEMS-based two-channel transceiver for wireless sensor networks," VLSI Circuits, 2004. Digest of Technical Papers. 2004 Symposium on, pp. 20-23, 17-19 Jun. 2004.

The invention claimed is:

1. Method for demodulating a radio frequency (RF) input signal to a demodulated output signal comprising:
receiving the RF input signal;
providing a first clock signal having a first reference period and a first signaling period and a first clock frequency, and applying the first clock signal to a first switching block;
switching in the first switching block to the RF input signal during the first signaling period and to a reference signal during the first reference period, thereby creating a first signal;
demodulating the first signal by an RF front end comprising an envelope detector, the RF front end having a non-linear transfer-characteristic, thereby creating a second signal;
providing a second clock signal having a second reference period and a second signaling period and a second clock frequency equal to the first clock frequency, and applying the second clock signal to a second switching and compensation block;
sampling the second signal in the second switching and compensation block so as to store a first sample of the second signal during the second signaling period and to store a second sample of the second signal during the second reference period; and
compensating the first sample by the second sample to obtain the demodulated output signal.

2. The method according to claim 1, wherein the RF input signal comprises an on-off modulated RF carrier.

3. The method according to claim 1, wherein the first clock signal has a duty cycle of 50%, and the second clock signal has a duty cycle in the range of 10%-40%.

4. The method according to claim 1, wherein the first clock signal has a duty cycle of 50%, and the second clock signal has a duty cycle in the range of 20%-30%.

5. The method according to claim 1, wherein the first clock signal has duty cycle of 50%, and the second clock signal has a duty cycle essentially equal to 25%.

6. The method according to claim 1, wherein the storage and compensation of the first and second samples of the second signal is achieved by connecting the second signal to a capacitor directly during the second signaling period, and inversely during the second reference period.

7. The method according to claim 1, wherein the storage of the first sample of the second signal is achieved by connecting the second signal to a first capacitor during the second signaling period, and the storage of the second sample of the second signal is achieved by connecting the second signal to a second capacitor during the second reference period, and the compensation is achieved by subtracting the charge stored on the second capacitor from the charge stored on the first capacitor.

8. The method according to claim 7,
wherein the subtracting is performed by a differential amplifier, and wherein the first capacitor is connected to a non-inverting input of the differential amplifier, and the second capacitor is connected to an inverting input of the differential amplifier.

9. The method according to claim 1, wherein the reference signal is ground.

10. The method according to claim 1, wherein the RF input signal is filtered by an RF band-pass filter before being applied to the first switching block.

11. The method according to claim 1, wherein the second signal is amplified by a baseband amplifier before being sampled in the second switching and compensation block.

12. The method according to claim 1,
wherein the second signal is filtered, by a second band-pass filter to retain only one side lobe, before being sampled in the second switching and compensation block, and
wherein the only one side lobe comprises a side lobe located at the first clock frequency.

13. The method according to claim 1, wherein the first clock frequency is higher than a corner frequency of the 1/f noise and a thermal noise intercept point of the RF front end.

14. An electronic radio frequency (RF) receiver circuit for demodulating an RF input signal, having a frequency spectrum with a lobe located at a carrier frequency, to a demodulated output signal, wherein the RF receiver circuit comprises:
a first clock circuit for providing a first clock signal having a first reference period and a first signaling period and a first clock frequency;
a first switching block for switching under control of the first clock signal to the RF input signal during the first signaling period and to a reference signal during the first reference period, thereby creating a first signal;
an RF front end for demodulating the first signal, the RF front end comprising an envelope detector and having a non-linear transfer-characteristic, thereby creating a second signal;
a second clock circuit for providing a second clock signal having a second reference period and a second signaling period and a second clock frequency equal to the first clock frequency; and
a second switching and compensation block for switching the second signal under control of the second clock signal so as to store a first sample of the second signal during the second signaling period and to store a second sample of the second signal during the second reference period, and to compensate the first sample by the second sample to obtain the demodulated output signal.

15. The electronic RF receiver circuit according to claim 14, wherein the RF input signal comprises an on-off modulated RF carrier.

16. The electronic RF receiver circuit according to claim 15, wherein the first clock signal has a duty cycle of 50%, and the second clock signal has a duty cycle in the range of 10%-40%.

17. The electronic RF receiver circuit according to claim 15, wherein the first clock signal has a duty cycle of 50%, and the second clock signal has a duty cycle in the range of 20%-30%.

18. The electronic RF receiver circuit according to claim 15, wherein the first clock signal has a duty cycle of 50%, and the second clock signal has a duty cycle that is essentially equal to 25%.

19. The electronic RF receiver circuit according to claim 14, wherein the first clock signal has a duty cycle of 50%, and the second clock signal has a duty cycle in the range of 10%-40%.

20. The electronic RF receiver circuit according to claim 14, wherein the first clock signal has a duty cycle of 50%, and the second clock signal has a duty cycle in the range of 20%-30%.

21. The electronic RF receiver circuit according to claim 14, wherein the first clock signal has a duty cycle of 50%, and the second clock signal has a duty cycle essentially equal to 25%.

22. The electronic RF receiver circuit according to claim 14 further comprising a capacitor,
wherein the storage and compensation of the first and second sample of the second signal is achieved by connecting the second signal to the capacitor directly during the second signaling period, and inversely during the second reference period.

23. The electronic RF receiver circuit according to claim 14 further comprising a first capacitor and a second capacitor,
wherein the storage of the first sample of the second signal is achieved by connecting the second signal to the first capacitor during the second signaling period, and the storage of the second sample of the second signal is achieved by connecting the second signal to the second capacitor during the second reference period, and the compensation is achieved by subtracting the charge stored on the second capacitor from the charge stored on the first capacitor.

24. The electronic RF receiver circuit according to claim 23,
wherein the subtracting is performed by a differential amplifier, and
wherein the first capacitor is connected to a non-inverting input of the differential amplifier, and the second capacitor is connected to an inverting input of the differential amplifier.

25. The electronic RF receiver circuit according to claim 14, wherein the reference signal is ground.

26. The electronic RF receiver circuit according to claim 14, further comprising:
an RF band-pass filter for filtering the RF input signal before entering the first switching block.

27. The electronic RF receiver circuit according to claim 14 further comprising:
a baseband amplifier located between the envelope detector and the second switching and compensation block, wherein the baseband amplifier amplifies the second signal.

28. The electronic RF receiver circuit according to claim 14 further comprising:
a second band-pass filter located between the envelope detector and the second switching and compensation block, wherein the second band-pass filter filters the second signal to retain only one side lobe before entering the second switching and compensation block, and
wherein the only one side lobe comprises a side lobe located at the first clock frequency.

29. The electronic RF receiver circuit according to claim 14, wherein the first clock frequency is higher than a corner frequency of the 1/f noise and a thermal noise intercept point of the RF front end.

30. An RF receiver comprising an electronic RF receiver circuit according to claim 14.

31. An electronic device comprising an RF receiver according to claim 30.

32. A method comprising:
using the RF receiver according to claim 31 as a wake-up receiver.

* * * * *